United States Patent [19]

Ito et al.

[11] Patent Number: 4,958,160
[45] Date of Patent: Sep. 18, 1990

[54] PROJECTION EXPOSURE APPARATUS AND METHOD OF CORRECTING PROJECTION ERROR

[75] Inventors: Yasuaki Ito, Hino; Takehiko Suzuki; Hirokazu Shimeki, both of Yokohama, all of Japan

[73] Assignee: Canon Kabushiki Kaisha, Tokyo, Japan

[21] Appl. No.: 238,196

[22] Filed: Aug. 30, 1988

[30] Foreign Application Priority Data

Aug. 31, 1987 [JP] Japan .................. 62-215201
Aug. 31, 1987 [JP] Japan .................. 62-215202

[51] Int. Cl.[5] ............................................. G03B 27/42
[52] U.S. Cl. ..................................... 355/53; 356/401; 355/43
[58] Field of Search ............. 355/53, 77, 43, 86, 355/95; 356/400, 401

[56] References Cited

U.S. PATENT DOCUMENTS 4,669,867 6/1987 Uda et al. .................. 355/53
4,811,059 3/1989 Hamasaki et al. .......... 355/53 X

FOREIGN PATENT DOCUMENTS 60-140826 7/1985 Japan .

Primary Examiner—L. T. Hix
Assistant Examiner—D. Rutledge
Attorney, Agent, or Firm—Fitzpatrick, Cella, Harper & Scinto

[57] ABSTRACT

A projection exposure apparatus in which a wafer is illuminated with a light of slit-like shape from a mask and a carriage for supporting the mask and the wafer as a unit is moved in a predetermined direction relative to a projection optical system, including a mirror system, wherein a pattern formed on the mask is printed on the wafer, is disclosed. By adjusting the attitude of the carriage during movement, a projection error of the pattern of the mask, being projected on the wafer, is corrected. Data necessary for adjusting the carriage attitude is obtained by photoelectrically detecting alignment marks of the mask and the wafer. As a feature, a setting device is provided to allow the setting of the number of wafers, of those of a predetermined number, which are to be treated as the subject of data detection. This makes the apparatus to easily meet either of the requirements of higher precision and higher throughput, as desired. Also, the amount of actual change in the attitude of the carriage, with respect to the instruction value based on the data, is preparatorily detected before the pattern printing and is memorized. This assures higher precision correction of the projection error.

4 Claims, 13 Drawing Sheets

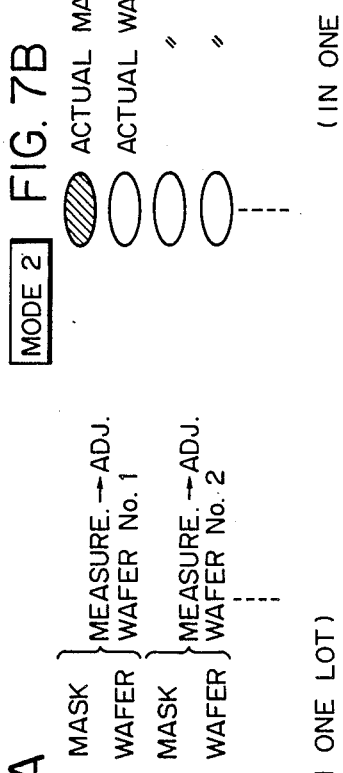
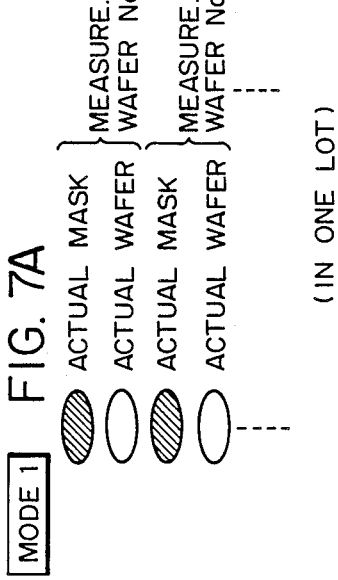
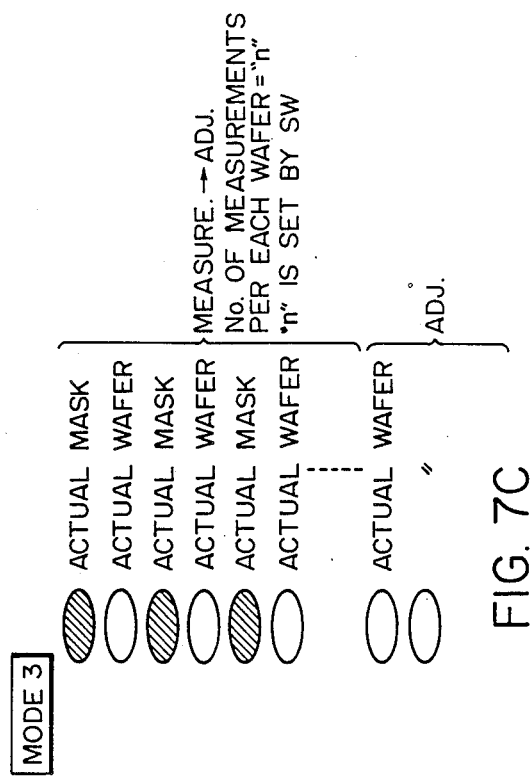

PROJECTION EXPOSURE APPARATUS AND METHOD OF CORRECTING PROJECTION ERROR

FIELD OF THE INVENTION AND RELATED ART

This invention relates to a projection exposure apparatus and, more particularly, to a projection exposure apparatus in which an original and a workpiece to be exposed are positionally aligned with each other and, thereafter, they are moved as a unit relative to a projection optical system so that a pattern of the original is photoprinted on the workpiece.

Exposure apparatuses as described are usable as an exposure apparatus having a projection type optical system, for use in the manufacture of semiconductor microcircuit devices such as IC, LSI, super LSI, etc., and are usable to photoprint an image of a circuit pattern of a mask on a wafer with high alignment accuracy.

In the exposure apparatus of the type that a mask and a wafer are moved as a unit relatively to a fixed projection optical system and a light of slitlike shape from the mask is projected through the projection optical system upon the wafer to photoprint the mask pattern on the wafer, generally there is a problem such as follows:

If the X-Y coordinate system that comprises a Y axis (scan direction) along which a structure (hereinafter "carriage") moves while supporting the mask and the wafer as a unit and an X axis in the direction normal to the Y axis, is deviated in a rotational ($\theta$) direction by an angle $\theta_1$, about a Z axis, from an X'-Y' coordinate system that comprises a Y' axis within a horizontal plane of the projection optical system and an X' axis in the direction normal to the Y' axis (wherein Z=Z'), there occurs curvature of field (distortion of image surface) with the result that the pattern of the mask is printed on the wafer with an inclination $2\theta_1$ with respect to the X-Y coordinate system.

As a solution for such problem, a proposal has been made in Japanese Laid-Open Patent Application, Laid-Open No. Sho 60-140826, laid open in Japan on July 25, 1985. This Japanese Laid-Open Patent Application discloses that the image surface distortions caused when the carriage is placed at different locations on the Y axis are measured preparatorily and the scanning exposure is made while adjusting the attitude of the carriage during the pattern transfer to thereby correct the image surface distortions.

As for the procedure of the distortion correction, namely, the measurement and adjustment for the inclination between the Y' axis of the projection optical system and the Y axis (carriage scan direction) and for the pattern transferring magnification (hereinafter these measurement and adjustment will be referred to simply "measurement" and "adjustment", respectively), the following two methods are disclosed.

(1) The measurement is made by use of a standard mask and a standard wafer and, after the measurement, a mask and a wafer for an actual process are used. The standard mask and the standard wafer are those which are not used in the actual printing, but they are used only for the measurement.

(2) Masks and wafers for actual processes are used, and the measurement is effected each time the alignment and printing are executed.

In the method (1) of the two methods, there is a difference (manufacturing error) between the standard mask and each mask for an actual process, the error itself being different for each process. Thus, it is necessary to correct the error, for each process. In the method (2), on the other hand, such a disadvantage may be avoided. However, the execution of measurement for each alignment and printing does result in decreased throughput. In the method (1), there is an additional problem that the necessity of replacement of the mask and wafer requires a substantial time.

Further, where the attitude adjustment for the carriage are to be made automatically, as in the aforementioned Japanese Laid-Open Patent Application No. Sho 60-140826, the quantity of attitude adjustment is calculated from measured values, obtained from marks provided on the mask and the wafer, respectively, and a carriage attitude adjusting mechanism is actuated in accordance with the calculation results. In such case, a problem which should be considered is the relationship between the quantity of adjustment as calculated from the measured values and the quantity of actual adjustment of the attitude of the carriage made by the attitude adjusting mechanism.

SUMMARY OF THE INVENTION

It is accordingly a primary object of the present invention to provide a projection exposure apparatus which assures both satisfactory precision and satisfactory throughput.

To achieve this object, according to one aspect of the present invention, there is provided a projection exposure apparatus for printing a pattern of an original upon a workpiece to be exposed, by moving along a guide mechanism, a carriage that supports the original and the workpiece as a unit, wherein a setting device is provided to allow a portion of one group of workpieces to be arbitrarily selected and set as the subject of measurement and, with regard to that portion of the group of workpieces, the measurement is effected prior to respective exposures. On the basis of the measured values, the attitude of the carriage is adjusted, for each workpiece. With regard to the remaining workpieces, the measurement is not effected and the attitude of the carriage is adjusted on the basis of the measured values, obtained precedingly.

Thus, according to this aspect of the present invention, any rotational deviation $\theta$ between an X-Y coordinate system that comprises a Y axis of the scan direction of a carriage and an X axis in the direction normal thereto and an X'-Y' coordinate system that comprises a Y' axis within a horizontal plane of the projection optical system and an X' axis in a direction normal thereto, as well as any pattern transferring magnification error are detected prior to the exposure. During the exposure, the carriage is moved while adjusting its attitude. Therefore, it is possible to prevent the image surface distortion due to the aforesaid rotational deviation θ or the pattern transferring magnification error. Further, upon detection of the rotational deviation, for example, an original and a workpiece for an actual process are used, and no standard original and no standard workpiece are used. Therefore, it is not necessary to correct any manufacturing error between a standard original and each original for an actual process. Also, it is possible to avoid disadvantageous decrease in the throughput due to the replacement of original and workpiece. Further, as for workpieces in a group (e.g., in one lot), the detection of the rotational deviation, for example, may be made only to desired ones of the workpieces. Therefore, the reduction in throughput in this respect can be avoided. As for the workpieces in one lot, substantially the same characteristics appear in regard to the image surface distortion, for example. Therefore, by detecting the rotational deviation, for example, with regard to only a portion of the group of the workpieces, it is possible to correct any overlay (alignment) error resulting from the rotational deviation, for example, between the carriage mechanism and the guide mechanism as well as from the image surface distortion or otherwise caused in the preceding processes.

Another object of the present invention is to provide a method of correcting a projection error of a projection exposure apparatus, which can easily meet variation, between different apparatuses, with regard to the calculated quantity of adjustment for the carriage attitude and the quantity of actual adjustment made by an attitude adjusting mechanism, or any change due to the environmental conditions.

To achieve this object, according to one aspect of the present invention, there is provided an exposure apparatus wherein a carriage which supports an original and a workpiece to be exposed, as a unit, is moved along a guide mechanism so that a pattern formed on the original is printed on the workpiece; and wherein, before the printing, the carriage is moved and, from the change in the positional deviation between the original and the workpiece at different positions of the carriage, the inclination between an optical axis of a projection optical system and a carriage scanning axis as well as a transferring magnification are measured. During the pattern transfer, the carriage mechanism is moved while adjusting its attitude on the basis of these measured values, such that the inclination and the transferring magnification are corrected. As an important feature, the relationship between an instructed or specified adjusting value to be applied to a carriage attitude adjusting mechanism and the quantity of actual attitude adjustment is measured preparatorily, and a function between the instructed adjusting value and the quantity of actual attitude adjustment is detected by calculation. Upon pattern transfer, the attitude adjustment for the carriage mechanism is executed on the basis of a corrected instruction value obtained by correcting the instructed adjusting value by use of the function.

Thus, according to this aspect of the present invention, upon automatic adjustment of the carriage attitude, it is possible to reduce the error between the quantity of adjustment as calculated from measured values concerning scan errors and the quantity of actual adjustment. Therefore, it is possible to assure higher precision exposure.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 7 is an explanatory view showing measuring and adjusting modes of the FIG. 1 apparatus.

DESCRIPTION OF THE PREFERRED EMBODIMENTS

Figure 1:
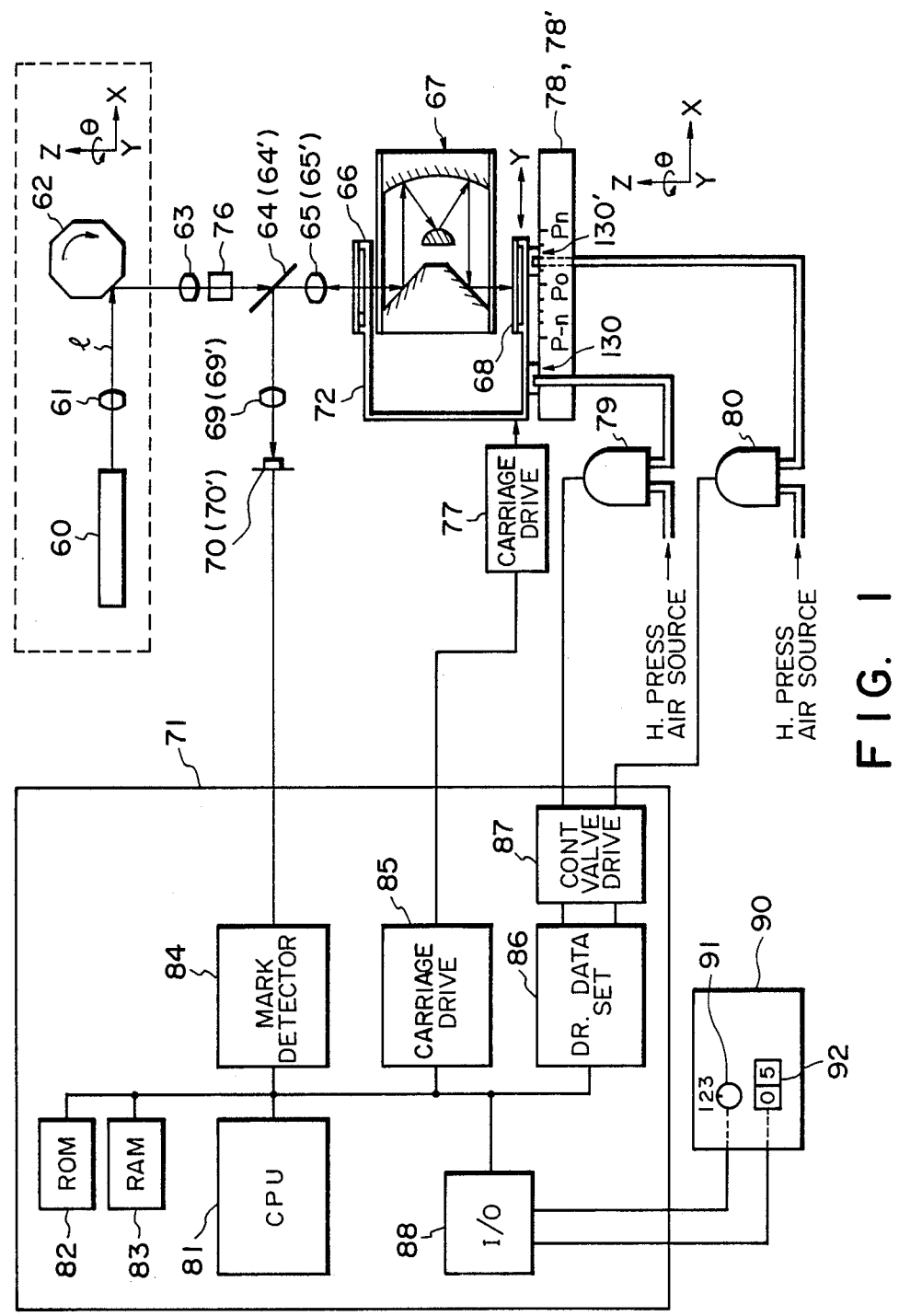
FIG. 1 is a schematic and diagrammatic view of a reflection projection type exposure apparatus according to one embodiment of the present invention.

FIG. 1 schematically shows the structure of a reflection projection type exposure apparatus according to one embodiment of the present invention. Along the path of a laser light 1 emitted from a laser light source 60, there are provided a condenser lens 61 and a polygonal mirror 62, in the named order.

The laser light source 60, the condenser lens 61 and the polygonal mirror 62 are actually disposed in a direction perpendicular to the sheet of the drawing (i.e., X direction), but they are illustrated as being rotated by 90 degrees about a Z axis. The laser light 1 is scanningly deflected in the X direction by the rotation of the polygonal mirror 62.

Along the path of the laser light 1 as reflected by the polygonal mirror 62, there are disposed in the named order an f-θ characteristic lens 63, a dividing prism 76 for bisecting the laser light 1 in the X direction, two half mirrors 64 (64'), unshown one being disposed in the X direction perpendicular to the sheet of the drawing, two objective lenses 65 (65'), a mask 66 having accurate alignment marks 101 (which will be described later) formed at different locations thereon, a reflection type projection optical system 67 and a wafer 68 having accurate alignment marks 102 (which will be described later) formed at different locations thereon.

The mask 66 and the wafer 68 are supported as a unit by a carriage 72 which is movable in the Y direction, as illustrated, by means of a carriage driving mechanism 77 while being guided by a guide mechanism that includes guide members 78 and 78' and air bearing assemblies 130 and 130'. For printing a circuit pattern of the mask 66 on the wafer 68, a light source 120 (see FIG. 2) illuminates the mask 66 with use of a light of slit-like shape and the carriage 72 moves.

Two reflected lights from the mask 66, the projection optical system 67 and the wafer 68 are reflected by the half mirrors 64 and 64', respectively. Along the paths of these reflected lights, two condenser lenses 69 (69') and two photoelectric converting elements 70 (70') are disposed. The outputs of these photoelectric converting elements 70 and 70' are applied to a computation processing circuit 71 and, on the basis of the outputs of the photoelectric converting elements 70 and 70', the positional relationship between the mask 66 and the wafer 68 can be detected. Further, by use of calculating equations described later, the magnification as well as the quantity of inclination between the optical axis (Y' axis) of the projection optical system 67 and the carriage scan axis (Y axis) can be calculated. In accordance with the results of calculation, the carriage driving mechanism 77 and control valves 79 and 80, controlling the air pressure to be supplied to the air bearing assemblies 130 and 131, are controlled so as to execute the adjustment of the inclination between the optical axis of the projection optical system 67 and the carriage scan axis as well as the adjustment of magnification.

The processing circuit 71 includes a central processing unit (CPU) for controlling the operation in the processing circuit 71; a read only memory (ROM) 82 in which a program of the operational sequence for the CPU 81 is stored; a random access memory (RAM) 83 for storing computation processing data; a mark measuring circuit 84 for measuring the interval between marks of the mask 66 and wafer 68, on the basis of the outputs of the photoelectric converting elements 70 and 70'; a carriage driving circuit 85 for controlling the carriage driving mechanism 77; a driving data setting circuit 86 for converting the computation processing data in the form of digital values to analog values and for setting them; control valve driving circuit 87 for actuating the control valves 79 and 80; an input/output interface 88.

Denoted at 91 is a switch for setting the measurement and adjustment mode; denoted at 92 is a switch for inputting the number of repeated measurements to be made; and denoted at 90 is an operation panel upon which the switches 91 and 92 are mounted. The switches 91 and 92 are coupled to the input/output interface 88 of the processing circuit 71, so that signals representing the states of the switches 91 and 92 are inputted into the CPU 81.

Figure 2:
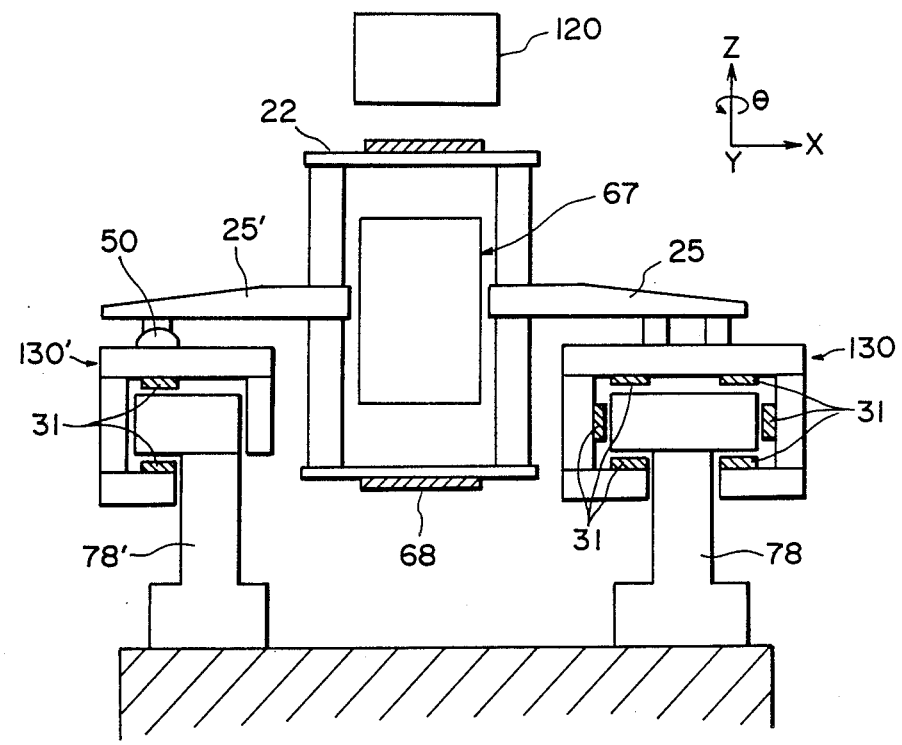
FIG. 2 is a schematic section of a carriage used in the FIG. 1 embodiment.

FIG. 2 is a schematic section showing the carriage 72 of FIG. 1, as seen in the direction of the Y axis.

Arms 25 and 25' are floatingly supported on guide members 78 and 78', respectively, through the air bearing assemblies 130 and 130' operable as floating devices. Denoted at 31 are bearing pads of these air bearing assemblies. Each pad 31 is coupled to an unshown high pressure air source by way of a corresponding control valve 79 or 80, and discharges a high pressure air. At the right-hand arm 25, six pads 31 whose air-discharging pressures are controlled by the control valve 79 are provided at upward, downward, leftward and rightward positions. At the left-hand arm 25, two pads 31 whose air-discharging pressures are controlled by the control valve 80 are provided at upward and downward positions. Thus, the right-hand air bearing assembly 130 provides an omnidirectional-restriction bearing assembly, while the left-hand air bearing assembly 130' provides a vertical-restriction bearing assembly. Accordingly, the left-hand air bearing assembly 130' is less than the right-hand air bearing assembly 130, in respect to the rigidity in the vertical direction and in the horizontal direction. Denoted at 50 is a spherical seat.

Figure 3:
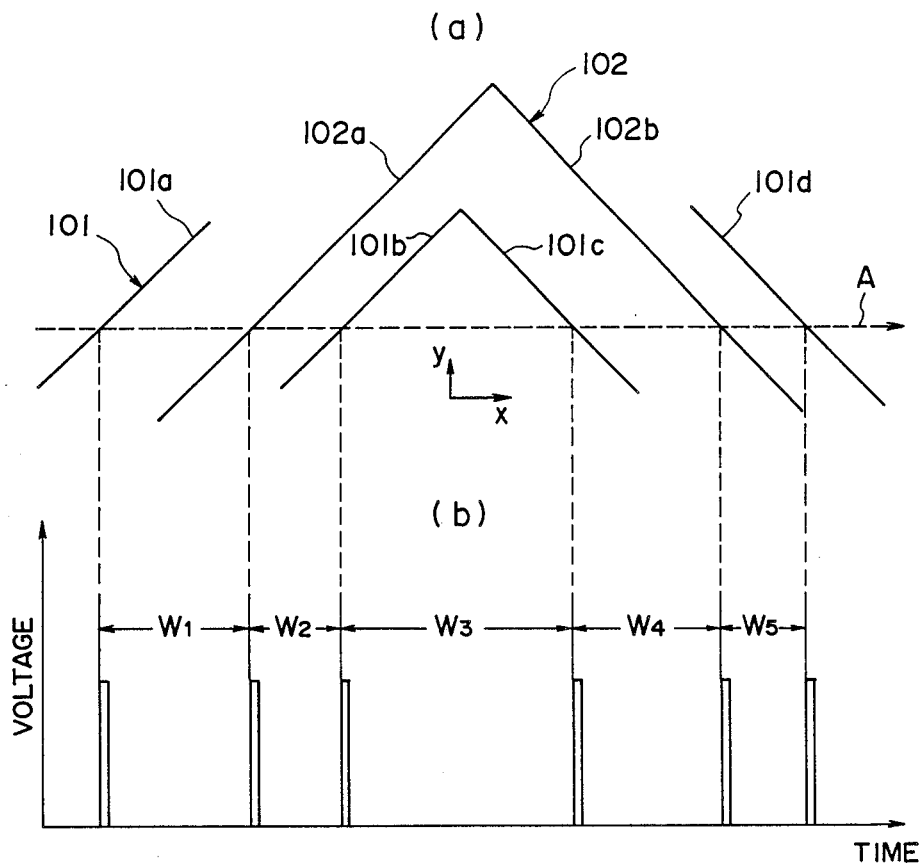
FIG. 3 is an explanatory view showing the relationship between the alignment marks of a mask and a wafer and outputs of a photoelectric converting element used in the FIG. 1 embodiment.
Figure 4:
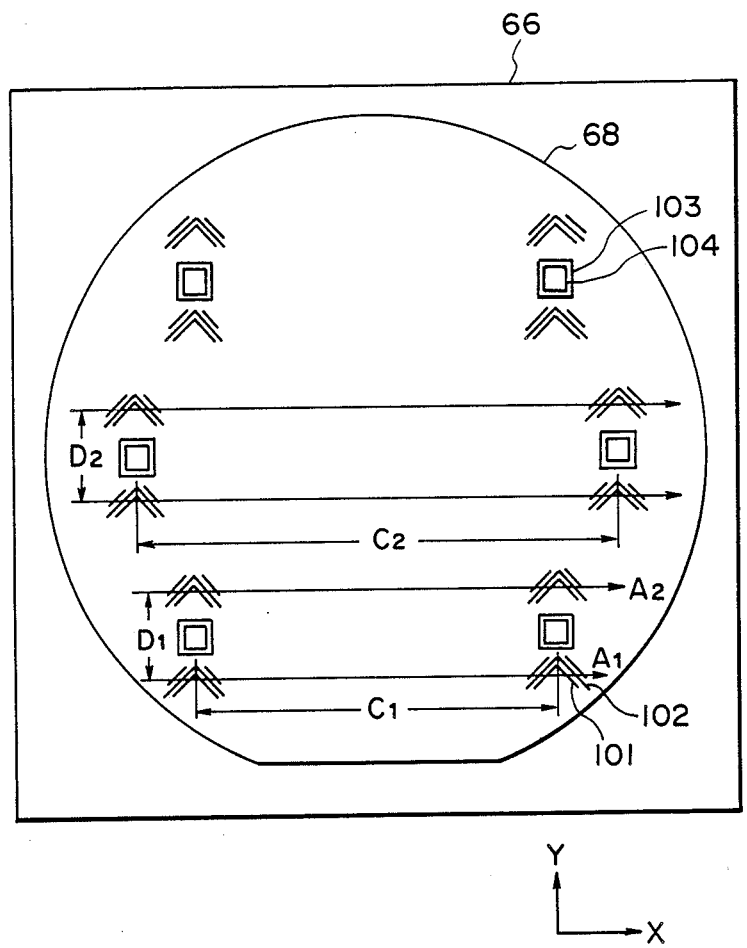
FIG. 4 is a schematic plan view showing the mask and wafer of FIG. 1, as superposed upon one another.

FIG. 3 shows alignment marks usable on a mask 66 and a wafer 68. An alignment mark 101 which comprises mark elements 101a, 101b, 101c and 101d is formed on the mask 66. An alignment mark 102 which comprises mark elements 102a and 102b is formed on the wafer 68. Actually, as illustrated in FIG. 4, plural mask alignment marks and plural wafer alignment marks are formed at twelve locations. In FIG. 4, reference numerals 103 and 104 denote alignment marks provided for naked-eye observation. One of the alignment marks 103 and 104 is formed on the mask 66, and the other is formed on the wafer 68.

The measurement and adjustment operation with the described structure will now be explained. Referring back to FIG. 1, the laser light 1 emitted from the laser light source 60 is scanned by the polygonal mirror 62 and is bisected by the dividing prism 76 in the X direction. The divided two lights pass through the half mirrors 64 and 64' and advance toward the mask 66. Two marks on the mask 66 (of the twelve alignment marks 101) arrayed in the X direction and two marks on the wafer 68 (of the twelve alignment marks 102) which correspond respectively to the two marks on the mask 66 side, are scanned in sequence by the laser light 1 through the optical system 67. The scattered lights from the sets of marks 101 and 102 go to the half mirrors 64 and 64', whereat portions thereof are reflected toward the two photoelectric converting elements 70 and 70'.

The alignment mark 101 of the mask 66 and the alignment mark 102 of the wafer 68 are structured so that, when they are superposed upon one another such as shown in FIG. 3, (a), the mark element 102a of the wafer 68 is placed between the mark elements 101a and 101b of the mask 66, while the mark element 102b is placed between the mark elements 101c and 101d. The laser light 1 is scanningly deflected from left to right in the direction of an arrow A (X direction). At the intersections of the laser light with the alignment marks 101 and 102, in FIG. 3, (a), the photoelectric converting element 70 (70') detects pulse-like lights and produces an output voltage of a waveform such as illustrated in FIG. 3, (b). Reference characters $W_1$, $W_2$, $W_3$, $W_4$ and $W_5$ denote intervals (spacings) of the pulse signals. By measuring these time intervals $W_1$-$W_5$ by use of the mark measuring circuit 84 of the processing circuit 71, an alignment error between the mask 66 and the wafer 68 can be detected.

More specifically, where, in FIG. 3, (a), the deviation in the X direction is denoted by $\Delta x$ and the deviation in the Y direction is denoted by $\Delta y$, it follows that:

$$\Delta x = (W_1 - W_2 + W_4 - W_5)/4 \quad (1)$$

$$\Delta y = (-W_1 + W_2 + W_4 - W_5)/4 \quad (2)$$

If the alignment is complete, $W_1 = W_2 = W_4 = W_5$. Therefore, $\Delta x$ and $\Delta y$ are both equal to zero.

As shown in FIG. 4, two alignment marks 101 and 102 of the mask 66 and the wafer 68, formed at two locations spaced by a distance C ($C_1$ or $C_2$) in the X direction, are detected respectively and the alignment error is determined in accordance with equations (1) and (2). Where the deviation $R_1$ of the right-hand mark is denoted by ($\Delta x_{R1}$, $\Delta y_{R1}$) and the deviation $L_1$ of the left-hand mark is denoted by ($\Delta x_{L1}$, $\Delta y_{L1}$), the lateral (X direction) magnification Mx is given by the following equation:

$$Mx = (1/C) \cdot \sqrt{(C + \Delta x_{L1} - \Delta x_{R1})^2 + (\Delta y_{L1} - \Delta y_{R1})^2} \quad (3)$$

Also, two alignment marks 101 and 102 formed at two locations spaced by a distance D ($D_1$ or $D_2$) in the Y direction is detected. Where the deviation $R_2$ of the right-hand mark is denoted by ($\Delta x_{R2}$, $\Delta y_{L2}$) and the deviation $L_2$ of the left-hand mark is denoted by ($\Delta y_{L2}$, $\Delta y_{L2}$), the vertical (Y direction) magnification My is given by the following equation:

$$My = (1/D) \cdot \sqrt{(\Delta x_{L1} - \Delta x_{L2})^2 + (D + \Delta y_{L1} - \Delta y_{L2})^2} \quad (4)$$

These calculations are made by the CPU 81 in the processing circuit 71

Figure 5:
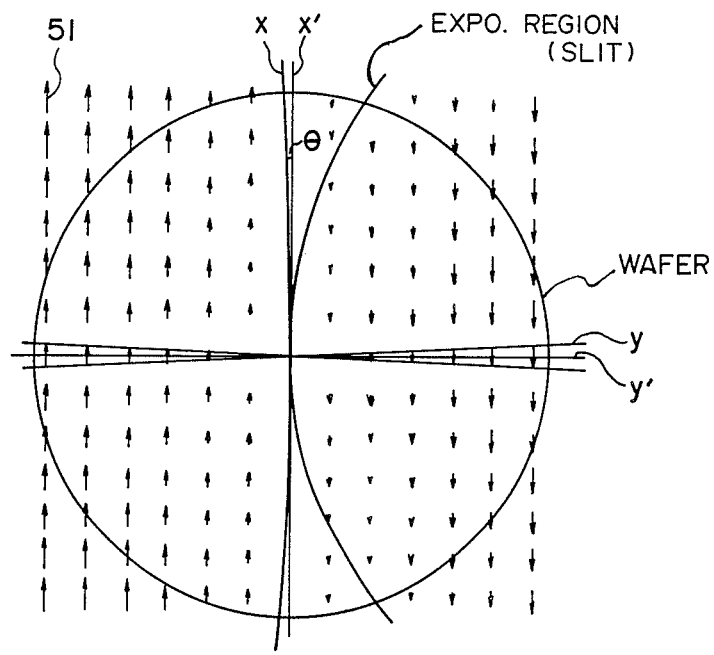
FIG. 5 is an explanatory view showing an error related to the projection of an image of a mask upon a wafer.
Figures 6A, 6B:
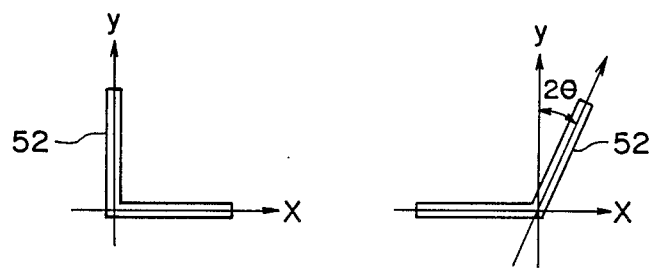
FIGS. 6A and 6B are explanatory views showing projected images of a mask upon a wafer.

FIG. 5 shows the relationship between an x'-y' coordinate of the optical system 67 and an x-y coordinate of the carriage 72 In this case, due to the inclusion of an angle $\theta$ between the x'-y' coordinate and the x-y coordinate, there occurs image surface distortion. Arrows 51 in FIG. 5 each denotes the direction and magnitude of projection distortion, for each 10 mm on the wafer surface. At this time, an L-shaped pattern 52 such as shown in FIG. 6A may be imaged on the wafer by the optical system 67 as a horizontally inverted image such as shown in FIG. 6B and, additionally, the pattern image portion in the y-axis direction is inclined by an angle $2\theta$ with respect to the y' axis.

Referring back to FIG. 4, the measurement of the angle $\theta$ will be described.

The lowermost two sets of alignment marks 101 and 102 in the X direction are placed on the optical axes of the two objective lenses 65 and 65', respectively, and the laser light 1 is scanningly deflected in the direction of an arrow $A_1$. In response, by the two photoelectric converting elements 70 and 70' and the processing circuit 71, the state of alignment is detected and the left-hand side alignment error ($\Delta x_{L1}$, $\Delta y_{L1}$) and the right-hand side error ($\Delta x_{R1}$, $\Delta y_{R1}$) are determined. Subsequently, in response to the instructions from the processing circuit 71, the carriage 72 is moved by the carriage driving mechanism 77 in the Y direction through a distance $D_1$, and the laser light 1 is scanningly deflected in the direction of an arrow A2 to thereby detect the state of alignment with regard to different alignment marks 101 and 102. Thus, similarly, the errors $\Delta x_{L2}$, $\Delta y_{L2}$, $\Delta x_{R2}$ and $\Delta y_{R2}$ are obtained. Here, the deviation angle $\theta x$, in the horizontal direction, between alignment marks 101 and 102 of the mask 66 and the wafer 68 spaced in the X direction by a distance $C_1$ (=C), can be approximately determined by the following equation:

$$\theta x = (\tfrac{1}{2}C) \cdot (\Delta y_{L1} - \Delta y_{R1} + \Delta y_{L2} - \Delta y_{R2}) \quad (5)$$

Also, the deviation angle $\Delta y$, in the vertical direction, between alignment marks 101 and 102 spaced in the Y direction by a distance $D_1$ (=D) can be approximately determined by the following equation:

$$\theta y = (\tfrac{1}{2}D) \cdot (\Delta x_{R1} - \Delta x_{L1} \Delta x_{R2} - \Delta x_{L2}) \quad (6)$$

These calculations are made by the processing circuit 71. The control valves 79 and 80 are adjusted during the carriage movement to adjust the attitude of the carriage 72, in the manner reducing these deviation angles, to thereby avoid the projection distortion error. The quantity of adjustment to be made can be expressed as follows:

$$\theta = (\theta y - \theta x) \cdot \tfrac{1}{2} \quad (7)$$

wherein $\theta x$ represents the misalignment component and a non-parallel component in which the optical axis (y' axis) and the scan axis (y axis) are not parallel to each other in a horizontal plane. By detecting at plural locations the above angle $\theta$ to be adjusted, the transfer distortion error can be dissolved more correctly.

In the apparatus of FIG. 1, by means of the switches 91 and 92 in the operation unit 90, the conditions for the measurement and the adjustment operation for the projection transfer error with regard to the mask 66 and wafer 69 can be variably set.

FIG. 7 is an explanatory view showing measurement and adjustment modes in the apparatus of FIG. 1. Mode 1 is an operation mode, like that in the apparatus as disclosed in the aforementioned Japanese Laid-Open Patent Application No. Sho 60-140826, in which the deviation is measured each time the alignment is effected and wherein the adjustment is made each time the printing is effected Mode 2 and mode 3 are those that allow increased throughput as compared with mode 1. In mode 2, only with regard to the first wafer, the deviation is measured at the time of alignment and the adjustment is made at the time of printing. Data concerning the first wafer is stored in the RAM 83 and, by use of such data, the adjustment to the second wafer and wafers following thereto is effected. As compared with mode 1, only one deviation measurement is necessary and, therefore, the throughput can be improved.

In mode 3, by a number of times as set by the switch 92 which is used to set the number of measurements to be made, deviation is measured for each alignment operation and adjustment is made for each printing operation. As for the subsequent wafers, the data concerning those wafers with respect to each of which the measurement has been conducted is averaged and the adjustment is made by use of the average data. In mode 3, by averaging the wafer data, the variation in the data concerning plural wafers can be averaged and, by this averaging effect, it is possible to suppress the variation in the measured values.

The desired one of these measurement and adjustment modes can be selected by turning the switch 91.

Next, the operation of the operational processing circuit 71 of FIG. 1 will be explained.

The mark detecting circuit 84 of the processing circuit 71 is connected to the outputs of the photoelectric converting elements 70 and 70' and is arranged to measure the intervals $W_1$-$W_5$ between the alignment marks as shown in FIG. 3, (b). Also, according to the above-described equations, the mark detecting circuit processes the measured values and stores them into the RAM 83. Upon adjustment, on the basis of the stored data, driving data for the control valves 79 and 80 is inputted into a driving data setting circuit 86 and, in response thereto, the control valve driving circuit 87 actuates the control valves 79 and 80 to thereby control the attitude of the carriage 72.

The carriage driving circuits 85 actuates the carriage driving mechanism 77.

This measurement and adjustment operation is controlled by the execution of the operational sequence, stored in the ROM 82, by the CPU 81.

In the ROM 82, such an operational sequence in which the measurement and adjustment mode is changeable by the mode setting switch 91, has been memorized.

Figure 8:
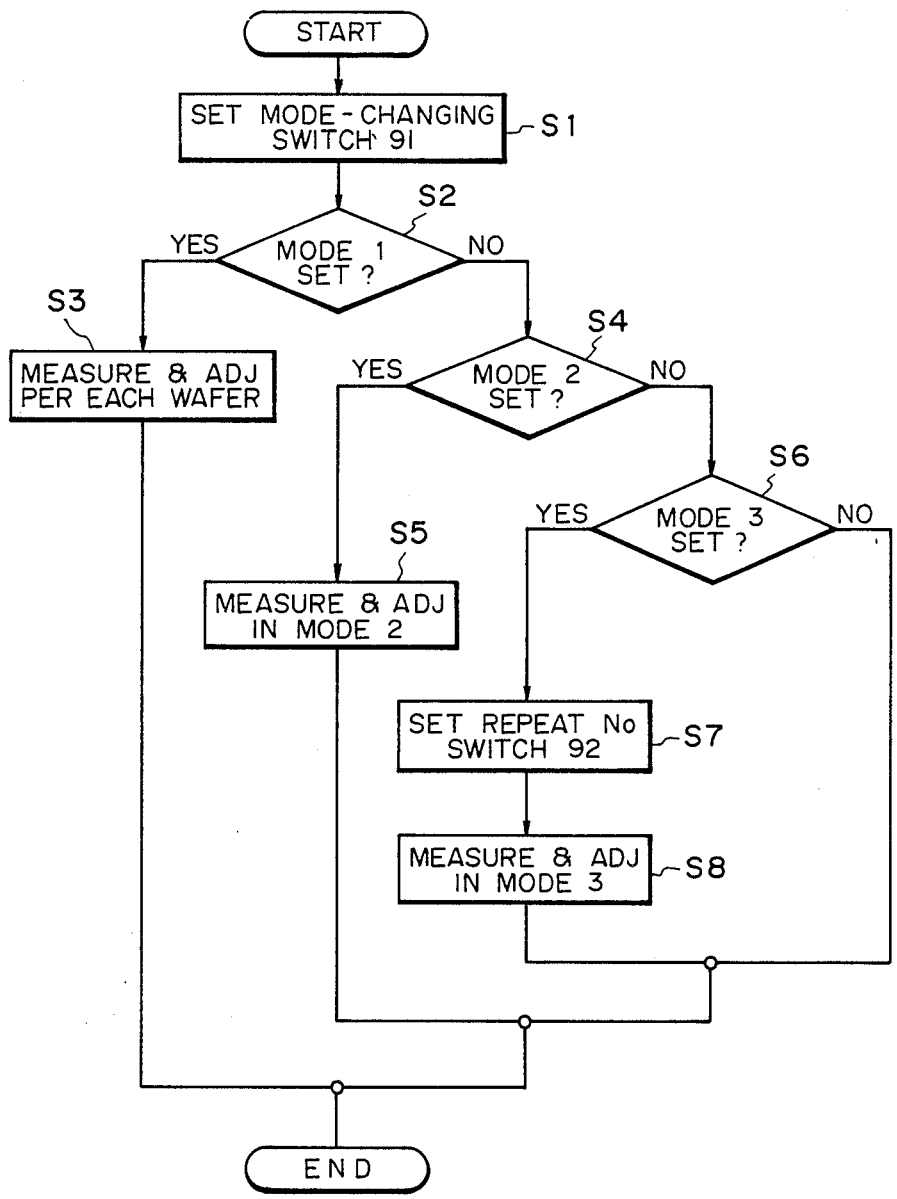
FIG. 8 is a flow chart showing the operation of the FIG. 1 apparatus.

FIG. 8 is a flow chart showing the changeability of the measurement and adjustment operation by means of the mode setting switch 91. Details of the operation will be explained, taken in conjunction with this flow chart. The operation is made under the control of the CPU 81.

First, at step S1, the state of the mode changing switch 91 to be set is inputted. Then, if at step S2 "mode 1" is discriminated, at step S3 the measurement and adjustment in mode 1 as has been described with reference to FIG. 7 is effected. If at step S4 "mode 2" is discriminated, at step S5 the measurement and adjustment in mode 2 shown in FIG. 7 is effected.

If at step S6 "mode 3" is discriminated, at step S7 the value to be set with regard to the repetition measurement number inputting switch 92 is inputted and, at step S8, the measurement and adjustment in mode 3 shown in FIG. 7 is effected.

In this manner, the desired one of the modes shown in FIG. 7 as well as a desired number of wafers to be measured, in mode 3, are set.

In accordance with the present embodiment, as has been described hereinbefore, actual masks and actual wafers are used, for the adjustment of transfer errors. Also, by use of switch means, a desired measurement and adjustment mode as well as a desired number of wafers, to be selected as the subject of measurement, can be selected. Therefore, an appropriate adjustment procedure can be selected in accordance with wafers or process difference and, by doing so, the precision in the transfer error adjustment can be retained. For example, where there is a large alignment error (measurement error), the averaging in mode 3 is effective. Also, where the stability of measurement is good, depending on wafers used, mode 2 described hereinbefore may be used so that the measurement is made only to the first wafer of one lot and, thereafter, the stored data is used for the remaining wafers. This allows improved throughput.

In this manner, according to a process, the measurement and adjustment mode as well as the number of the subjects of measurement can be selected as desired and, by doing so, the apparatus can be operated effectively.

In the embodiment described hereinbefore, the measurement data to be used actually can be obtained manually. More specifically, a manual set data circuit may be prepared so that, for wafers or processes with respect to which a large error occurs in the measurement of alignment marks, the marks 103 and 104 (see FIG. 4) may be observed manually by naked-eye observation and the quantity of adjustment may be set and inputted into the controller in accordance with the naked-eye observation.

Also, in addition to such an operational sequence in which the positional deviation is measured automatically and is adjusted automatically at the time of printing, such a sequence in which the printing operation starts after a start switch is depressed, may be adopted. By doing so, and by adding such a sequence in which adjustment data is inputted after the measurement of deviation so that discrimination can made as to whether the deviation has been corrected exactly, the degree of success of the adjustment can be checked.

Figure 9:
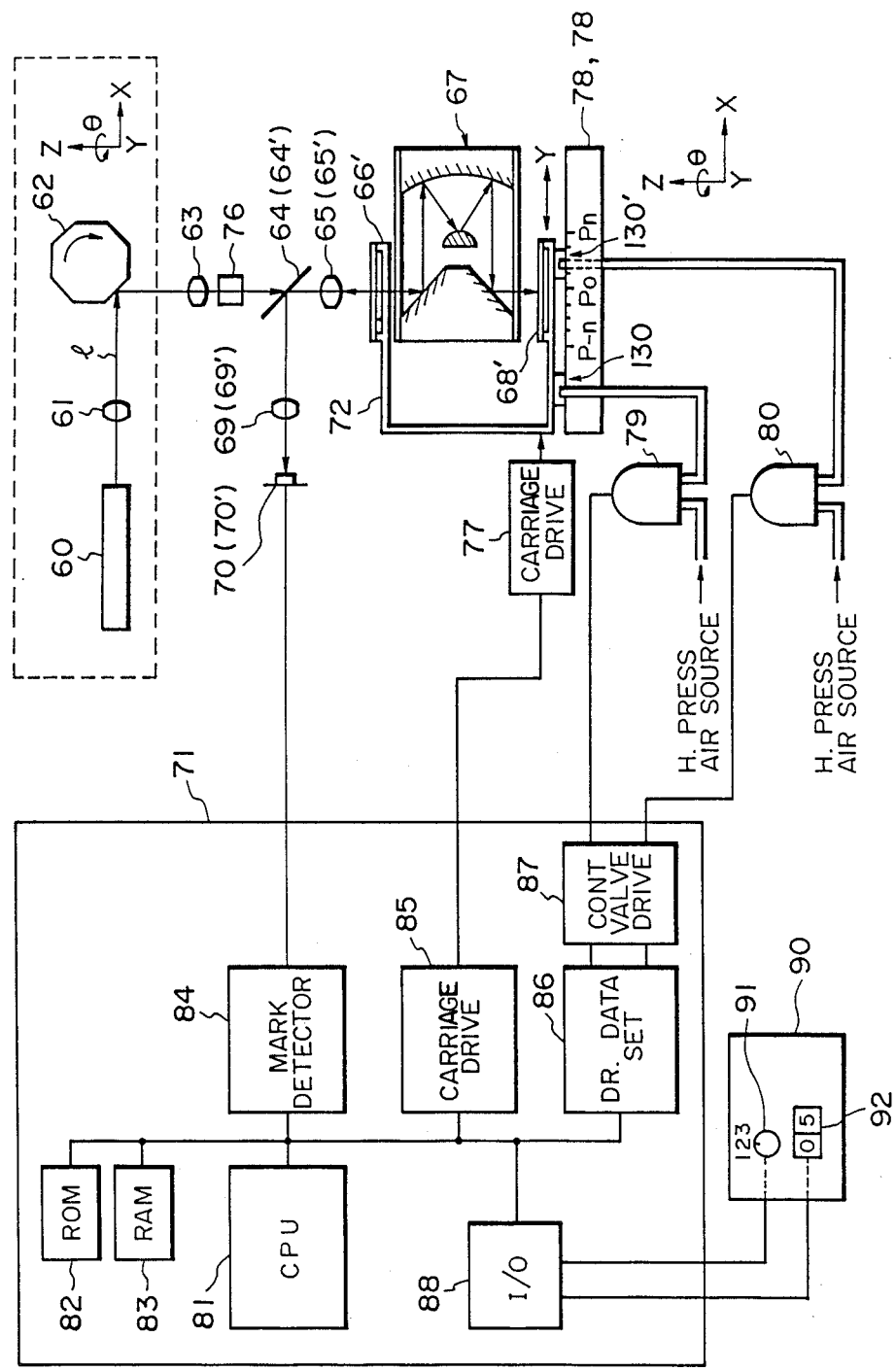
FIG. 9 is a schematic and diagrammatic view of a reflection projection type exposure apparatus according to another embodiment of the present invention.

FIG. 9 schematically shows the structure of a reflection projection type exposure apparatus according to another embodiment of the present invention.

Along the path of a laser light 1 emitted from a laser light source 60, there are provided a condenser lens 61 and a polygonal mirror 62, in the named order.

The laser light source 60, the condenser lens 61 and the polygonal mirror 62 are actually disposed in a direction perpendicular to the sheet of the drawing (i.e., X direction), but they are illustrated as being rotated by 90 degrees about a Z axis. The laser light 1 is scanningly deflected in the X direction by the rotation of the polygonal mirror 62.

Along the path of the laser light 1 as reflected by the polygonal mirror 62, there are disposed in the named order an f-θ characteristic lens 63, a dividing prism 76 for bisecting the laser light 1 in the X direction, two half mirrors 64 (64'), unshown one being disposed in the X direction perpendicular to the sheet of the drawing, two objective lenses 65 (65'), a standard mask 66' having accurate alignment marks 101 (which will be described later) formed at different locations thereon, a reflection type projection optical system 67 and a standard wafer 68' having accurate alignment marks 102 (which will be described later) formed at different locations thereon.

The mask 66' and the wafer 68' are supported as a unit by a carriage 72 which is movable in the Y direction, as illustrated, by means of a carriage driving mechanism 77 while being guided by a guide mechanism that includes guide members 78 and 78' and air bearing assemblies 130 and 130'. For printing a circuit pattern of an actual mask on an actual wafer, a light source (not shown) illuminates the mask with use of a light of slit-like shape and the carriage 72 moves.

Two reflected lights from the mask 66', the projection optical system 67 and the wafer 68' are reflected by the half mirrors 64 and 64', respectively. Along the paths of these reflected lights, two condenser lenses 69 (69') and two photoelectric converting elements 70 (70') are disposed. The outputs of these photoelectric converting elements 70 and 70' are applied to a computation processing circuit 71 and, on the basis of the outputs of the photoelectric converting elements 70 and 70', the positional relationship between the mask 66' and the wafer 68' can be detected. Further, by use of calculating equations described later, the magnification as well as the quantity of inclination between the optical axis (Y' axis) of the projection optical system 67 and the carriage scan axis (Y axis) can be calculated. In accordance with the results of calculation, the carriage driving mechanism 77 and control valves 79 and 80 are controlled so as to execute the adjustment of the inclination between the optical axis of the projection optical system 67 and the carriage scan axis as well as the adjustment of magnification.

The standard mask 66' and the standard wafer 68' are mounted to the carriage 72 for the adjustment, and they are replaced by a mask and a wafer for an actual process, at the time of actual pattern transfer.

The processing circuit 71 includes a central processing unit (CPU) for controlling the operation in the processing circuit 71; a read only memory (ROM) 82 in which a program of the operational sequence for the CPU 81 is stored; a random access memory (RAM) 83 for memorizing computation processing data; a mark measuring circuit 84 for measuring the interval between marks of the mask 66' and wafer 68', on the basis of the outputs of the photoelectric converting elements 70 and 70'; a carriage driving circuit 85 for controlling the carriage driving mechanism 77; a driving data setting circuit 86 for converting the computation processing data in the form of digital values to analog values and for setting them; control valve driving circuit 87 for actuating the control valves 79 and 80; an input/output interface 88 and so on.

To the input/output interface 88, operation switches provided on an operation panel 90, a display 92 such as a light emitting diode or otherwise, as well as unshown keyboard and so on are connected.

The remaining portion of the structure, the provision of alignment marks on the mask and the wafer as well as the measurement of deviation on the basis of the mark spacings are essentially the same as in the FIG. 1 embodiment. Therefore, description thereof will be omitted here for simplicity.

Figure 10:
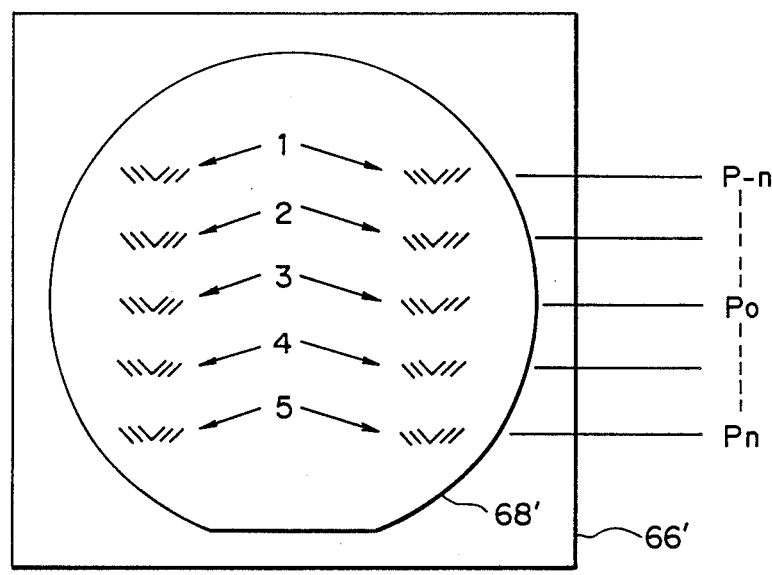
FIG. 10 is a schematic plan view showing a mask and a wafer of FIG. 9, as superposed upon one another.

FIG. 10 is a schematic plan view showing the mask 66' and the wafer 68', when superposed, as viewed from the above. Reference numerals 1–5 denote pairs of alignment marks such as those shown in FIG. 3, (a). These pairs are formed so as to correspond to the carriage positions $P_{-n}, \ldots, P_0, \ldots$ and $P_n$ shown in FIG. 9.

Figure 11:
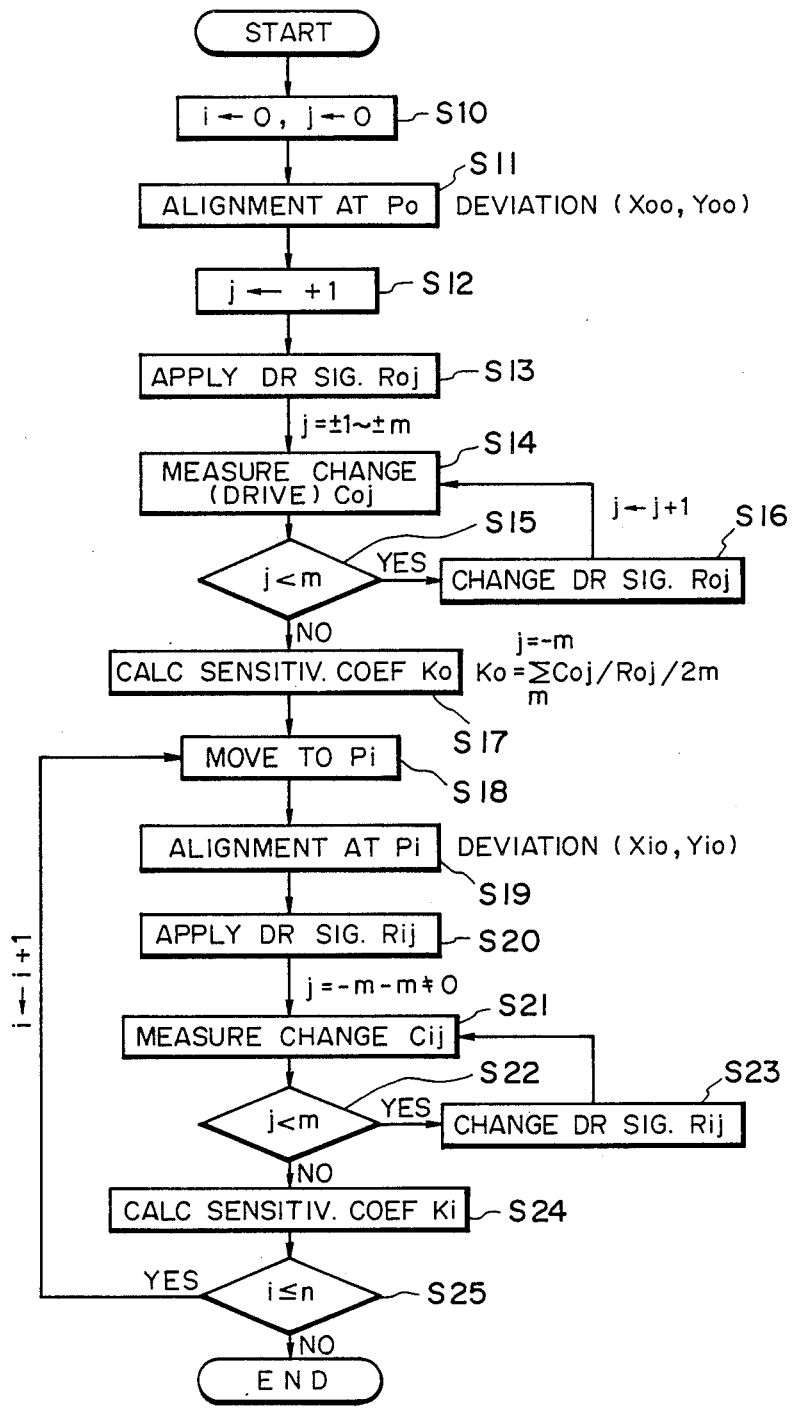
FIG. 11 is a flow chart showing a correction function preparing procedure in the FIG. 9 apparatus.

Referring to the flow chart of FIG. 11, the correction function preparing procedure in the FIG. 9 apparatus will be explained.

The CPU 81 of the processing circuit 71 operates first at step S11 to align the mask 66' with the wafer 68' at the position Pi (where i is in the range of $-n$ to n), e.g. $P_0$, by use of alignment marks. At this time, the residual alignment error $C_{00}$ between the mask 66' and the wafer 68' is ($\Delta x_{00}$, $\Delta y_{00}$). Subsequently, at step S13, a driving instruction value $R_{0j}$ (wherein j is in the range of $-m$ to m) is applied to a driving data setting circuit 86 to change the amount of control for the control valves 79 and 80, to thereby change the attitude of the carriage 72. As the amount of change in the carriage attitude at this time, at step S14 the alignment error $C_{0j}$ is measured in a similar manner using alignment marks of the mask and the wafer, the measured value being memorized in the RAM 83.

The alignment error $C_{0j}(x_{0j}, y_{0j})$ at the position $P_0$ can be rewritten as follows, where the deviation at the right-hand alignment mark is denoted by ($\Delta x_{R0j}$, $\Delta y_{R0j}$) and the deviation at the left-hand alignment mark is denoted by ($\Delta x_{L0j}$, $\Delta y_{L0j}$):

$$x_{i0} = (\Delta x_{R0j} + \Delta x_{L0j})/2$$

$$y_{i0} = (\Delta y_{R0j} + \Delta y_{L0j})/2$$

When the measurement of the error $C_{0j}$ with regard to all "j" ($= -m$ to m, wherein m≠0) is completed by steps S15 and S16, the sensitivity coefficient $K_0$ at the position P0 is calculated at step S17 by using the following equation:

$$K_0 = (\tfrac{1}{2}m) \cdot \sum_{m}^{j=-m} (C_{0j} - C_{00})/R_{0j}$$

The sensitivity coefficient $K_0$ and the alignment error $C_{00}$ ($\Delta x_{00}$, $\Delta y_{00}$) are stored into the RAM 83.

When the above-described processing with regard to the position $P_0$ is completed, the CPU 81 operates in accordance with step S18–S25 to move the carriage 72 through the carriage driving circuit 85, and at a different position $P_i$ the amount $C_{ij}$ of change in the carriage attitude with respect to drive instruction values $R_{ij}$ (j= −m to m), is measured and the sensitivity coefficient $K_i$ is calculated, the measured and calculated values being memorized in the RAM 83.

In this manner, with regard to all the positions $P_i$ (i= −n to n), the calculation and measurement of the sensitivity coefficient $K_i$ and the deviation $C_{i0}$ upon non-drive time, as well as the storing of these values into the RAM 83 are executed and the correction function preparing processing is completed.

Here, the deviation at the right-hand mark is determined with respect to the pulse intervals $W_{1R}$, $W_{2R}$, $W_{3R}$, $W_{4R}$ and $W_{5R}$ as outputted from the mark detecting circuit 84, as follows:

$$\Delta x_{Rij} = (W_{1R} - W_{2R} + W_{4R} - W_{5R})/4$$

$$\Delta x_{Rij} = (-W_{1R} + W_{2R} + W_{4R} - W_{5R})/4$$

The deviation of the left-hand mark can be determined with respect to the pulse intervals $W_{1L}$, $W_{2L}$, $W_{3L}$, $W_{4L}$ and $W_{5L}$, as follows:

$$\Delta x_{Lij} = (W_{1L} - W_{2L} + W_{4L} - W_{5L})/4$$

$$\Delta y_{Lij} = (-W_{1L} + W_{2L} + W_{4L} - W_{5L})/4$$

The amount $C_j(x_{ij}, y_{ij})$ of change at this time can be expressed as follows:

$$x_{ij} = (\Delta x_{Rij} + \Delta x_{Lij})/2 - (\Delta x_{Ri0} + \Delta x_{Li0})/2$$

$$y_{ij} = (\Delta y_{Rij} + \Delta y_{Lij})/2 - (\Delta y_{Ri0} + \Delta y_{Li0})/2$$

Figure 12:
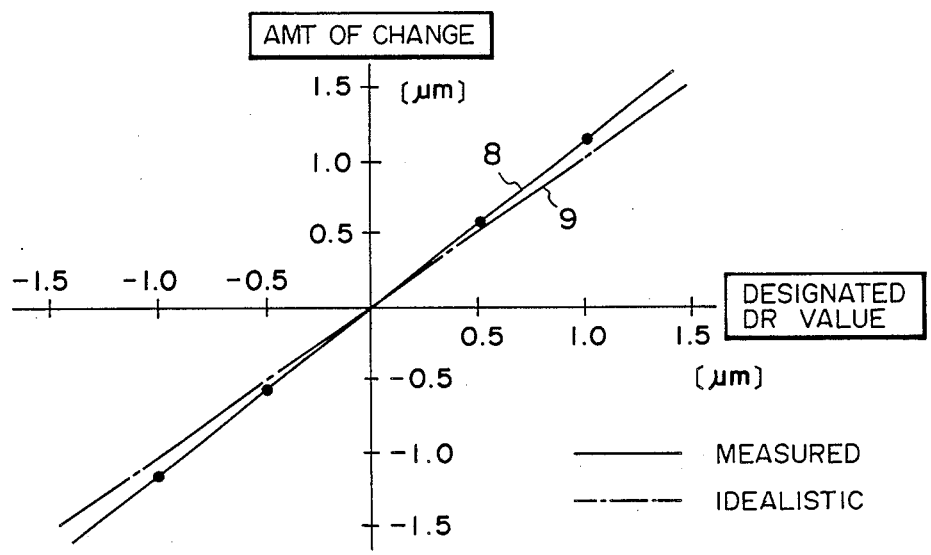
FIG. 12 is a graph showing the relationship between an instructed drive value and the amount of change in the carriage attitude.

FIG. 12 shows an example of a function related to the amount of change ($C_i$) and the drive instruction value $R_i$, obtainable in the described manner.

In an idealistic state, the amount of change ($C_i$) in the attitude of the carriage 72 caused by the air bearing assemblies 130 and 130' and the drive instruction value $R_i$ are in a one-to-one relation such as illustrated by a broken line 9. Usually, however, they are not in a completely one-to-one relation, such as depicted by a solid line 8.

In consideration of this, in the present embodiment, at each position the inclination $C_i/R_i$ is calculated as the sensitivity coefficient $K_i$. At the time of actual adjustment of the attitude of the carriage 72, and in respect to the quantity of adjustment ($M_i$) determined on the basis of the deviation between the marks, a new adjustment quantity $M_i$ $(=M_i/K_i)$ is calculated and, also, a value (correction instruction value) $R_i'$ corresponding thereto is determined. This correction instruction value $R_i'$ is outputted in place of the above-described drive instruction value $R_i$. By doing so, it is possible to make the amount of actual drive ($D_i$) of the carriage 72 to be equal to the quantity of adjustment ($M_i$).

In the manner described hereinbefore, in the present embodiment and at each carriage position $P_i$, the transfer error can be corrected with the drive amount $D_i$ which is equal to the adjustment quantity $M_i$.

The sensitivity coefficient K may be determined as a sensitivity coefficient per drive amount, i.e., $K_{ij}(=C_{ij}/R_{ij})$.

Figure 13A:
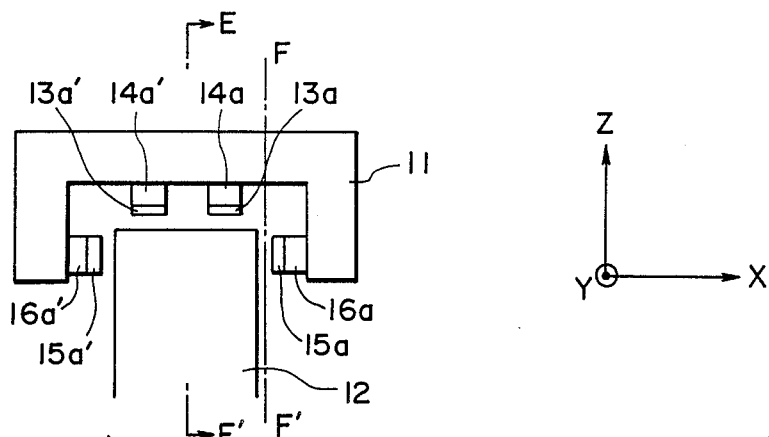
FIGS. 13, 14 and 15 are explanatory views, respectively, showing other examples of carriage adjusting mechanisms.
Figure 13B:
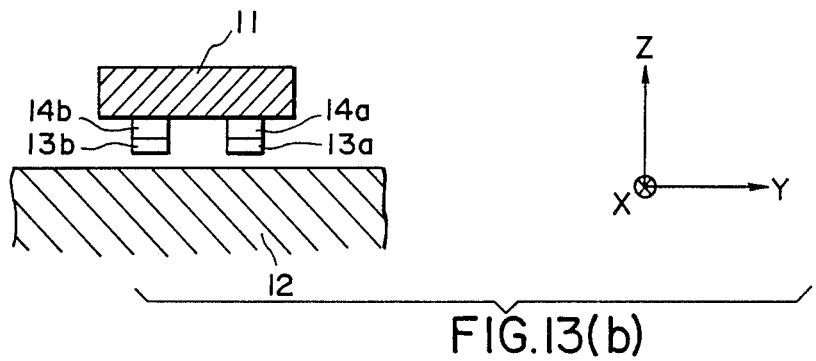
Figure 13C:
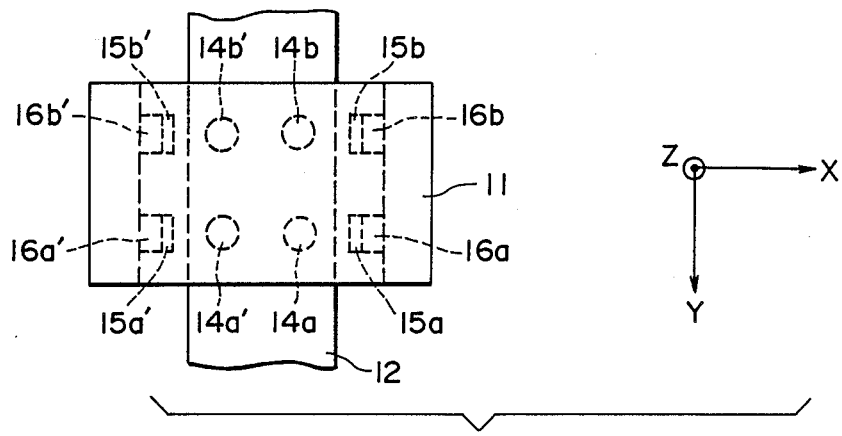

FIGS. 13, (a), (b) and (c), shows a modified form of the mechanism for adjusting the attitude of the carriage Part (a) of FIG. 13 is a front elevational view, part (b) is a sectional side view of a portion sandwiched between lines E—E' and F—F' in part (a), and part (c) is a top plan view of the portion shown in part (a). Denoted at 11 is a slider (movable table) which is movable in the X direction as shown. By means of four gas supplying pads 13a, 13a', 13b and 13b', the slider 11 is floated with respect to the Z direction in the drawing, relatively to a fixed guide 12. The movable table 11 corresponds to the above-described carriage 72, for example. Four minutely displaceable members 14a, 14a', 14b and 14b' are provided between the slider 11 and the pads 13a, 13a', 13b and 13b'. As for these members 14a–14b', a piezoelectric device or a diaphragm member which can be actuated to expand/contract by a fluid pressure, may be used. Four gas supplying pads 15a, 15a', 15b and 15b' are provided to restrict the position of the slider 11 in the Y direction in the drawing. Four minutely displaceable members 16a, 16a', 16b and 16b' are provided between the slider 11 and the pads 15a, 15a', 15b and 15b'.

Figure 14A:
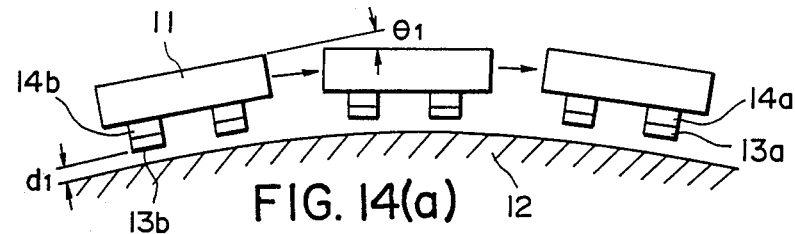
Figure 14B:
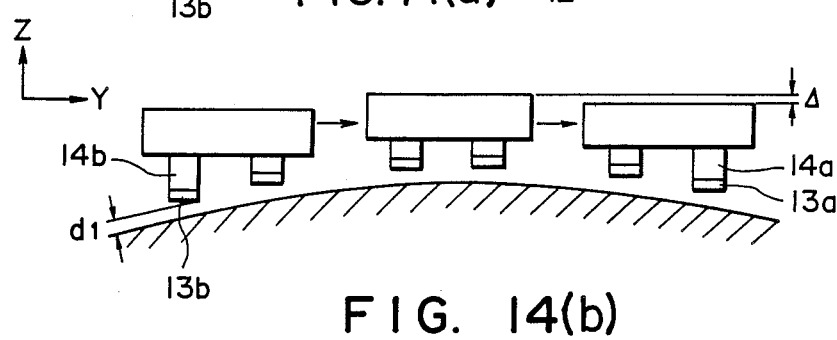
Figure 15A:
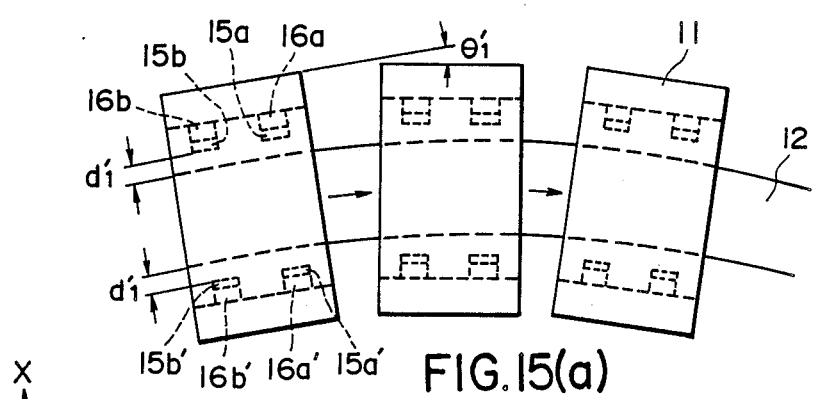
Figure 15B:
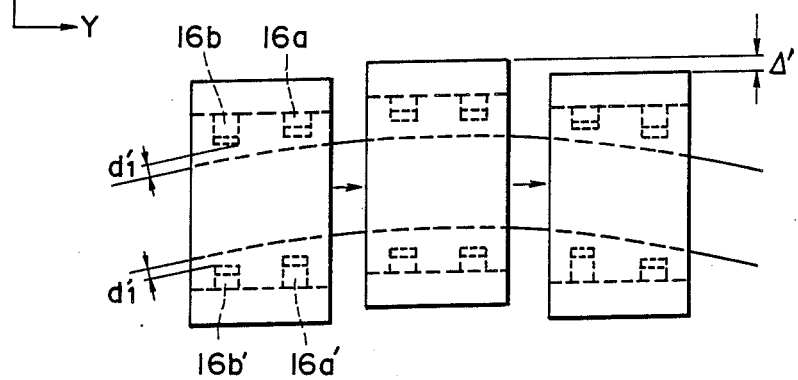

FIGS. 14, (a) and (b), and FIGS. 15, (a) and (b), show with emphasis the action of the movable table in the direction of pitching and in the direction of yawing, respectively.

The attitude control for the movable table in the pitching direction, in this modified example, will be explained, taken in conjunction with FIG. 14.

The quantity of correction to be made at each position of the table 11 with respect to the rectilinearly advancing direction, is preparatorily measured and calculated by means of the photoelectric detecting elements 70 and 70' and the processing circuit 71. Upon actual control, the position of the moving table 11 in the advancing direction is detected by an unshown position detector and, by the amount of correction to be made at that position, the minutely displaceable members 14a, 14a', 14b and 14b' during the movement of the table 11 are controlled to control the attitude of the table 11, to thereby execute the correction of precision error as having been measured preparatorily.

In FIG. 14, (a), unless the weight of the movable portion such as the slider or otherwise and the gas supplying pressure to the pads 13a–13b' do not change, the interval $d_1$ between the guide 12 and the pads is maintained constant. Therefore, the slider 11 moves along a convex curve following the convex surface of the guide 12. As a result, there occurs an error in the direction of pitching by an angle $\theta_1$. In FIG. 14, (b), on the other hand, at the movement start position, the minutely displaceable members 14b and 14b', for example, which are mounted to the rear pads 13b and 13b' are expanded to retain the interval $d_1$ between the guide and the pads. As the slider 11 moves and becomes close to the center of the movable range, there members 14b and 14b' are contracted. After passing the center of the movable range, the minutely displaceable members 14a and 14a' mounted to the front pads 13a and 13a' are gradually expanded. The attitude control is made in this manner to reduce the error $\theta_1$ in the pitching direction to zero.

It will be readily understood that, where the surface shape of the guide 12 is concave, the manner of control of the minutely displaceable members (contraction and expansion) made in the abovedescribed case of convex surface, may be inverted. As a matter of course, accordingly, where the surface shape of the guide 12 contains convexity and concavity, the controls to be made in the cases of a convex surface shape and a concave surface shape, may be made in combination.

Next, the attitude control for the movable table in the direction of yawing will be explained, taken in conjunction with FIG. 15. FIG. 15 shows a case wherein a guide 12 is curved rightwardly with respect to the rectilinearly advancing direction. In FIG. 15, (a), unless the gas supplying pressure to the pads 15a, 15b, 15a' and 15b' does not change, the interval $d_1'$ between the guide 12 and the pads is maintained constant Therefore, the slider 11 moves along the shape of guide 12. As a result, there occurs an error in the yawing direction of an angle $\theta 1'$. In FIG. 15, (b), at the movement starting position the minutely displaceable members 16a' and 16b, for example, are expanded so as to retain the interval $d_1'$ between the guide and the pads. As the slider moves and becomes close to the center of movement, these members 16a' and 16b are contracted. After passing the center of movement, the minutely displaceable members 16a and 16b' are expanded gradually. The attitude control is made in this manner to reduce the error $\theta_1'$ in the yawing direction to zero.

It will be readily understood that, where the guide 12 is curved leftwardly with respect to the rectilinearly advancing direction, the minutely displaceable members may be controlled invertedly. Where the guide 12 is curved leftwardly and rightwardly, these control methods may of course be executed in combination.

In accordance with the present embodiment, as has been described hereinbefore, a function with regard to a drive instruction value for adjusting the attitude of the carriage and to the amount of actual carriage adjustment is detected and, by use of such a function, the drive instruction value is corrected to obtain a corrected instruction value. By using this, the attitude of the carriage is adjusted. Therefore, the transfer error can be corrected with such a drive amount exactly corresponding to the adjustment quantity.

Where a standard mask and a standard wafer are used, it is possible to correct or compensate for scanning characteristics peculiar to the apparatus. Also, autoalignment marks provided on scribe lines on an actual mask and an actual wafer may be used.

Further, for each wafer or, alternatively, for each wafers of a predetermined number (or for each predetermined time), the measurement of the sensitivity K may be made. By doing so, it is possible to correct or compensate for any change with time of the scanning mechanism.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus usable with a group of workpieces for moving an original and a workpiece as a unit while irradiating the original with a slit-shaped light, to thereby print a pattern of the original onto the workpiece, said apparatus comprising:
   a movable carriage for supporting the original and the workpiece;
   a guide mechanism for guiding movement of said carriage;
   detecting means for detecting a relationship between marks on the original and corresponding marks on the workpiece while moving said carriage and determining a quantity of adjustment to be made in the attitude of said carriage;
   storing means for storing adjustment data representing the quantity of attitude adjustment to be made;
   adjusting means for adjusting the attitude of said carriage on the basis of the adjustment data stored in said storing means, wherein said adjusting means cooperates with said guiding mechanism to adjust the attitude during movement of said carriage when printing the pattern of the original onto the workpiece; and
   sequence control means for controlling the movement of said carriage when the pattern of the original is going to be printed onto the group of workpieces in sequence, wherein (1) with respect to a predetermined number of workpieces the movement of said carriage is initiated after the quantity of adjustment to be made in the attitude of said carriage is detected by said detecting means, stored into said storing means, and used by said adjusting means to adjust the attitude of said carriage and (2) with respect to the remaining workpieces the movement of said carriage is initiated without further detecting by said detecting means.

2. An exposure apparatus according to claim 1, wherein said sequence control means includes setting means for setting said predetermined number.

3. An exposure apparatus for moving an original and a workpiece as a unit while irradiating the original with a slitshaped light, to thereby print a pattern for supporting the original and the workpiece;
   a movable carriage for supporting the original and the workpiece;
   a guide mechanism for guiding movement of said carriage;
   detecting means for detecting a state of alignment between the original and the workpiece by use of marks provided on the original and the workpiece;
   adjusting means for adjusting the attitude of said carriage relative to said guide mechanism;
   storing means for storing a corrective value representing an actual quantity of adjustment to be made by said adjusting means and an adjustment instruction value to be applied to said adjusting means, wherein the corrective value is based on the state of alignment detected by said detecting means when a predetermined adjustment instruction value is applied to said adjusting means; and sequence control means for (1) controlling the movement of said carriage to determine the quantity of attitude adjustment of said carriage to be made during the printing of the pattern of the original onto the workpiece on the basis of the state of alignment detected by said detecting means and (2) applying the adjustment instruction value, determined by the corrective value corresponding to the quantity of attitude adjustment to be made of said carriage, to said adjusting means to cause said adjusting means to adjust the attitude of said carriage, said adjustment instruction value being applied when said carriage is moved to print the pattern of the original onto the workpiece.

4. A correction method for use with an exposure apparatus for moving an original and a workpiece as a unit while irradiating the original with a slit-shaped light, to thereby print a pattern of the original onto the workpiece, said method comprising the steps of:

applying a predetermined instruction value to an adjusting means operable to adjust the attitude of a carriage supporting the original and the workpiece relative to a guide mechanism for guiding the movement of the carriage;

detecting a sensitivity coefficient of the adjusting means, on the basis of a change in an output of a detecting means for detecting the state of alignment between the original and the workpiece caused when said predetermined instruction value is applied to the adjusting means;

moving the carriage to detect a quantity of adjustment of the carriage to be made during the printing of the pattern of the original onto the workpiece based on the output of the detecting means; and applying a corrected instruction value which is calculated by use of said sensitivity coefficient and a drive instruction value corresponding to the detected quantity of attitude adjustment, to cause the adjusting means to adjust the attitude of the carriage on the basis of said corrected instruction value, said corrected instruction value being applied when the carriage is moved to print the pattern of the original onto the workpiece.

* * * * *

UNITED STATES PATENT AND TRADEMARK OFFICE
CERTIFICATE OF CORRECTION

PATENT NO. : 4,958,160
DATED : September 18, 1990
INVENTOR(S) : YASUAKI ITO, ET AL.

It is certified that error appears in the above-identified patent and that said Letters Patent is hereby corrected as shown below:

COLUMN 1

Line 26, "slitlike" should read --slit-like--.
Line 61, "simply" should read --simply as--.

COLUMN 5

Line 40, "131," should read --130',--.
Line 60, "80; an" should read --80; and an--.

COLUMN 6

Line 25, "is" should read --provides--.

COLUMN 7

Line 59, "72 In" should read --72. In--.

COLUMN 8

Line 32, "angle $\Delta y$," should read --angle $\theta y$,--.
Line 37, "$\theta y = (\frac{1}{2}D) \cdot (\Delta x_{R1} - \Delta x_{L1} \Delta x_{R2} - \Delta x_{L2})$" should read
--$\theta y = (\frac{1}{2}D) \cdot (\Delta x_{R1} - \Delta x_{L1} - \Delta x_{R2} - \Delta x_{L2})$--.

COLUMN 9

Line 2, "effected  Mode 2" should read --effected.  Mode 2--.
Line 45, "circuits 85" should read --circuit 85--.

UNITED STATES PATENT AND TRADEMARK OFFICE
CERTIFICATE OF CORRECTION

PATENT NO. : 4,958,160

DATED : September 18, 1990

INVENTOR(S) : YASUAKI ITO, ET AL.

It is certified that error appears in the above-identified patent and that said Letters Patent is hereby corrected as shown below:

COLUMN 12

Line 56, "position P0" should read --position $P_0$--.
Line 67, "step S18-S25" should read --steps S18-S25--.

COLUMN 13

Line 9, "deviation CiO" should read --deviation $C_{10}$--.
Line 20, "$\Delta x_{Rij}=(-W_{1R}+W_{2R}+W_{4R}-W_{5R})/4$" should read
--$\Delta y_{Rij}=(-W_{1R}+W_{2R}+W_{4R}-W_{5R})/4$--.
Line 57, "quantity $M_i$" should read --quantity $M_i'$--.

COLUMN 14

Line 5, "carriage" should read --carriage.--.
Line 67, "there" should read --the--.

COLUMN 15

Line 9, "abovedescribed" should read --above-described--.
Line 26, "angle θ1'." should read --angle $\theta_1'$.--.
Line 61, "wafers" should read --wafer--.

COLUMN 16

Line 49, "slitshaped" should read --slit-shaped-- and "for supporting" should be deleted.

UNITED STATES PATENT AND TRADEMARK OFFICE
CERTIFICATE OF CORRECTION

PATENT NO. : 4,958,160
DATED : September 18, 1990
INVENTOR(S) : YASUAKI ITO, ET AL.

It is certified that error appears in the above-identified patent and that said Letters Patent is hereby corrected as shown below:

COLUMN 16

Line 50 should read --of the original onto the workpiece, said apparatus comprising:--.

Signed and Sealed this

Fourteenth Day of June, 1994

Attest:

BRUCE LEHMAN

Attesting Officer      Commissioner of Patents and Trademarks